US011626844B2

(12) United States Patent
Khlat et al.

(10) Patent No.: US 11,626,844 B2
(45) Date of Patent: Apr. 11, 2023

(54) ENVELOPE TRACKING RADIO FREQUENCY FRONT-END CIRCUIT

(71) Applicant: Qorvo US, Inc., Greensboro, NC (US)

(72) Inventors: Nadim Khlat, Cugnaux (FR); Marcus Granger-Jones, San Jose, CA (US)

(73) Assignee: Qorvo US, Inc., Greensboro, NC (US)

( * ) Notice: Subject to any disclaimer, the term of this patent is extended or adjusted under 35 U.S.C. 154(b) by 145 days.

(21) Appl. No.: 17/183,714

(22) Filed: Feb. 24, 2021

(65) Prior Publication Data
US 2021/0281229 A1 Sep. 9, 2021

Related U.S. Application Data

(60) Provisional application No. 62/986,992, filed on Mar. 9, 2020.

(51) Int. Cl.
*H03F 1/30* (2006.01)
*H03F 3/24* (2006.01)
(Continued)

(52) U.S. Cl.
CPC ........... *H03F 3/245* (2013.01); *H03F 1/0227* (2013.01); *H03F 3/195* (2013.01); *H03F 2200/102* (2013.01); *H03F 2200/451* (2013.01)

(58) Field of Classification Search
CPC ........................................................ H03F 1/30
(Continued)

(56) References Cited

U.S. PATENT DOCUMENTS

| 5,507,171 A | 4/1996 | Mattes et al. |
| 6,032,109 A | 2/2000 | Ritmiller, III |

(Continued)

FOREIGN PATENT DOCUMENTS

JP S601915 A 1/1985

OTHER PUBLICATIONS

Ying, K. et al., "A Wideband Envelope Detector with Low Ripple and High Detection Speed," IEEE International Symposium on Circuits and Systems (ISCAS), May 27-30, 2018, Florence, Italy, IEEE, 5 pages.

(Continued)

*Primary Examiner* — Henry Choe
(74) *Attorney, Agent, or Firm* — Withrow & Terranova, P.L.L.C.

(57) ABSTRACT

An envelope tracking (ET) radio frequency (RF) front-end circuit is provided. The ET RF front-end circuit includes an ET integrated circuit(s) (ETIC(s)), a local transceiver circuit, a target voltage circuit(s), and a number of power amplifiers. The local transceiver circuit receives an input signal(s) from a coupled baseband transceiver and generates a number of RF signals. The target voltage circuit(s) generates a time-variant ET target voltage(s) based on the input signal(s). The ETIC(s) generates multiple ET voltages based on the time-variant ET target voltage(s). The power amplifiers amplify the RF signals based on the ET voltages. Given that the time-variant ET target voltage(s) is generated inside the self-contained ET RF front-end circuit, it is possible to reduce distortion in the time-variant ET target voltage(s), thus helping to improve operating efficiency of the power amplifiers, especially when the RF signals are modulated with a higher modulation bandwidth (e.g., ≥200 MHz).

20 Claims, 4 Drawing Sheets

(51) Int. Cl.
*H03F 3/195* (2006.01)
*H03F 1/02* (2006.01)

(58) Field of Classification Search
USPC .............................. 330/297, 129, 136, 124 R
See application file for complete search history.

(56) References Cited

U.S. PATENT DOCUMENTS

| | | | |
|---|---|---|---|
| 6,556,077 B2 | 4/2003 | Schaffer et al. | |
| 6,724,202 B2 | 4/2004 | Tanizawa | |
| 7,616,062 B2 | 11/2009 | Miyamoto et al. | |
| 8,433,263 B2 | 4/2013 | Pratt et al. | |
| 9,190,959 B2 | 11/2015 | Camuffo et al. | |
| 9,288,098 B2 | 3/2016 | Yan et al. | |
| 10,439,557 B2 | 10/2019 | Khlat et al. | |
| 11,018,627 B2 | 5/2021 | Khlat | |
| 11,057,012 B2 | 7/2021 | Khlat | |
| 11,431,295 B2 * | 8/2022 | Khlat | H03F 1/0216 |
| 2007/0290748 A1 | 12/2007 | Woo et al. | |
| 2011/0136452 A1 | 6/2011 | Pratt et al. | |
| 2014/0273897 A1 * | 9/2014 | Drogi | H02M 3/1582 455/127.3 |
| 2021/0099135 A1 * | 4/2021 | Balteanu | H03F 3/72 |
| 2022/0085766 A1 * | 3/2022 | Balteanu | H03F 1/0227 |

OTHER PUBLICATIONS

U.S. Appl. No. 17/142,350, filed Jan. 6, 2021.
U.S. Appl. No. 17/142,507, filed Jan. 6, 2021.
U.S. Appl. No. 17/163,685, filed Feb. 1, 2021.
Non-Final Office Action for U.S. Appl. No. 17/142,350, dated Sep. 15, 2022, 9 pages.
Non-Final Office Action for U.S. Appl. No. 17/142,507, dated Aug. 17, 2022, 6 pages.
Notice of Allowance for U.S. Appl. No. 17/163,685, dated Aug. 29, 2022, 7 pages.
Notice of Allowance for U.S. Appl. No. 17/142,507, dated Feb. 16, 2023, 7 pages.

* cited by examiner

ENVELOPE TRACKING RADIO FREQUENCY FRONT-END CIRCUIT

RELATED APPLICATIONS

This application claims the benefit of provisional patent application Ser. No. 62/986,992, filed Mar. 9, 2020, the disclosure of which is incorporated herein by reference in its entirety.

FIELD OF THE DISCLOSURE

The technology of the disclosure relates generally to an envelope tracking (ET) radio frequency (RF) front-end circuit having multiple power amplifiers.

BACKGROUND

Mobile communication devices have become increasingly common in current society for providing wireless communication services. The prevalence of these mobile communication devices is driven in part by the many functions that are now enabled on such devices. Increased processing capabilities in such devices means that mobile communication devices have evolved from being pure communication tools into sophisticated mobile multimedia centers that enable enhanced user experiences.

A fifth-generation new radio (5G-NR) wireless communication system is widely regarded as a technological advancement that can achieve significantly higher data throughput, improved coverage range, enhanced signaling efficiency, and reduced latency compared to the existing third-generation (3G) and fourth-generation (4G) communication systems. A 5G-NR mobile communication device usually transmits and receives a radio frequency (RF) signal(s) in a millimeter wave (mmWave) RF spectrum that is typically above 6 GHz. Notably, the RF signal(s) transmitted in the mmWave RF spectrum may be more susceptible to propagation attenuation and interference that can result in substantial reduction in data throughput. To help mitigate propagation attenuation and maintain desirable data throughput, the 5G-NR mobile communication device may be configured to transmit the RF signal(s) simultaneously from multiple antennas using such spatial multiplexing schemes as multiple-input multiple-output (MIMO) and RF beamforming. As such, the 5G-NR mobile communication device needs to employ multiple power amplifiers in an RF front-end module (FEM) to amplify the RF signal(s) before feeding to the multiple antennas.

Envelope tracking (ET) is a power management technique designed to improve operating efficiency of the power amplifiers. Specifically, the power amplifiers simultaneously amplify the RF signal(s) based on multiple ET voltages that track a time-variant power envelope of the RF signal(s). Understandably, the better the ET voltages can track the time-variant power envelope, the more efficient the power amplifier can operate.

In a conventional implementation, the RF signal(s) and the time-variant power envelope are both generated by a baseband transceiver, which is typically coupled to the RF FEM by a conductive trace that can stretch several centimeters. Notably, the longer the distance between the baseband transceiver and the RF FEM, the higher the trace conductance there can be between the baseband transceiver and the RF FEM. As a result, the time-variant power envelope may be distorted to compromise performance and efficiency of the power amplifiers in the RF FEM.

SUMMARY

Embodiments of the disclosure relate to an envelope tracking (ET) radio frequency (RF) front-end circuit. In embodiments disclosed herein, the ET RF front-end circuit is self-contained to include an ET integrated circuit(s) (ETIC(s)), a local transceiver circuit, a target voltage circuit(s), and a number of power amplifiers. The local transceiver circuit receives an input signal(s) from a coupled baseband transceiver and generates a number of RF signals. The target voltage circuit(s) generates a time-variant ET target voltage(s) based on the input signal(s). The ETIC(s) generates a number of ET voltages based on the time-variant ET target voltage(s). The power amplifiers amplify the RF signals based on the ET voltages. Given that the time-variant ET target voltage(s) is generated inside the self-contained ET RF front-end circuit, it is possible to reduce distortion in the time-variant ET target voltage(s), thus helping to improve operating efficiency of the power amplifiers, especially when the RF signals are modulated with a higher modulation bandwidth (e.g., ≥200 MHz).

In one aspect, an ET RF front-end circuit is provided. The ET RF front-end circuit includes an ETIC configured to generate a number of first ET voltages and a second ET voltage based on a time-variant ET target voltage. The ET RF front-end circuit also includes a target voltage circuit configured to generate the time-variant ET target voltage based on an input signal. The ET RF front-end circuit also includes a local transceiver circuit configured to generate a number of RF signals based on the input signal. The ET RF front-end circuit also includes a number of power amplifiers coupled to a plurality of antenna ports, respectively. Each of the power amplifiers includes a driver stage amplifier configured to amplify a respective one of the RF signals based on the second ET voltage. Each of the power amplifiers also includes one or more output stage amplifiers coupled between the driver stage amplifier and a respective one of the antenna ports. The output stage amplifiers are configured to further amplify the respective one of the RF signals based on a respective one of the first ET voltages.

In another aspect, a wireless device is provided. The wireless device includes a number of ET RF front-end circuits. Each of the ET RF front-end circuits includes an ETIC configured to generate a number of first ET voltages and a second ET voltage based on a time-variant ET target voltage. Each of the ET RF front-end circuits also includes a target voltage circuit configured to generate the time-variant ET target voltage based on an input signal. Each of the ET RF front-end circuits also includes a local transceiver circuit configured to generate a number of RF signals based on the input signal. Each of the ET RF front-end circuits also includes a number of power amplifiers coupled to a plurality of antenna ports, respectively. Each of the power amplifiers includes a driver stage amplifier configured to amplify a respective one of the RF signals based on the second ET voltage. Each of the power amplifiers also includes one or more output stage amplifiers coupled between the driver stage amplifier and a respective one of the antenna ports. The output stage amplifiers are configured to further amplify the respective one of the RF signals based on a respective one of the first ET voltages.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

Figure 1:
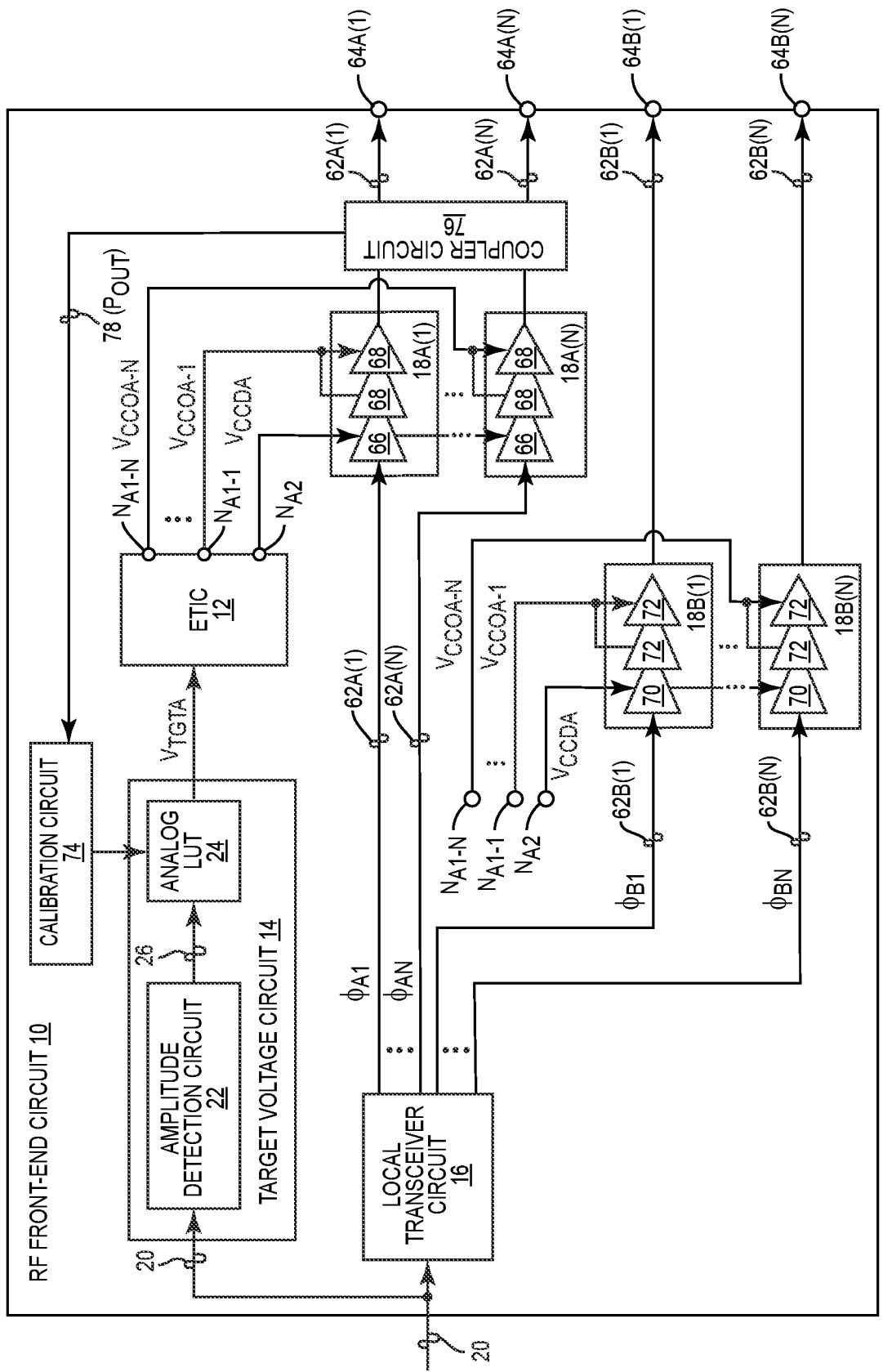
FIG. 1 is a schematic diagram of an exemplary envelope tracking (ET) radio frequency (RF) front-end circuit configured according to an embodiment of the present disclosure.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Embodiments of the disclosure relate to an envelope tracking (ET) radio frequency (RF) front-end circuit. In embodiments disclosed herein, the ET RF front-end circuit is self-contained to include an ET integrated circuit(s) (ETIC(s)), a local transceiver circuit, a target voltage circuit(s), and a number of power amplifiers. The local transceiver circuit receives an input signal(s) from a coupled baseband transceiver and generates a number of RF signals. The target voltage circuit(s) generates a time-variant ET target voltage(s) based on the input signal(s). The ETIC(s) generates a number of ET voltages based on the time-variant ET target voltage(s). The power amplifiers amplify the RF signals based on the ET voltages. Given that the time-variant ET target voltage(s) is generated inside the self-contained ET RF front-end circuit, it is possible to reduce distortion in the time-variant ET target voltage(s), thus helping to improve operating efficiency of the power amplifiers, especially when the RF signals are modulated with a higher modulation bandwidth (e.g., ≥200 MHz).

FIG. 1 is a schematic diagram of an exemplary ET RF front-end circuit 10 configured according to an embodiment of the present disclosure. In embodiments disclosed herein, the ET RF front-end circuit 10 is self-contained in a system-on-chip (SoC) or system-in-package (SiP), as an example, to provide all essential functions of an RF front-end module (FEM). Specifically, the ET RF front-end circuit 10 is configured to include an ETIC 12, a target voltage circuit 14, a local transceiver circuit 16, and a number of power amplifiers 18A(1)-18A(N). The ET RF front-end circuit 10 may also include a number of second power amplifiers 18B(1)-18B(N). By packaging the ETIC 12, the target voltage circuit 14, the local transceiver circuit 16, the power amplifiers 18A(1)-18A(N), and the second power amplifiers 18B(1)-18B(N) into the ET RF front-end circuit 10, it is possible to reduce distance-related distortion in the aforementioned conventional implementation, thus helping to improve operating efficiency and linearity of the power amplifiers 18(1)-18(N).

The ETIC 12 is configured to generate a number of first ET voltages $V_{CCOA-1}$-$V_{CCOA-N}$ at a number of first output nodes $N_{41-1}$-$N_{41-N}$, respectively. The ETIC 12 is also configured to generate a second ET voltage $V_{CCDA}$ at a second output node $N_{42}$. The ETIC 12 generates both the first ET voltages $V_{CCOA-1}$-$V_{CCOA-N}$ and the second ET voltage $V_{CCDA}$ based on a time-variant ET target voltage $V_{TGTA}$. For a detailed description on specific embodiments of the ETIC 12 that generate the first ET voltages $V_{CCOA-1}$-$V_{CCOA-N}$ and the second ET voltage $V_{CCDA}$ based on the time-variant ET target voltage $V_{TGTA}$, please refer to U.S. patent application Ser. No. 17/142,507, entitled "ENVELOPE TRACKING POWER MANAGEMENT APPARATUS INCORPORATING MULTIPLE POWER AMPLIFIERS."

The target voltage circuit 14 is configured to generate the time-variant ET target voltage $V_{TGTA}$ based on an input signal 20, which can be a modulated carrier signal at millimeter wave (mmWave) frequency, intermediate frequency (IF), or In-phase/Quadrature (I/Q) baseband frequency. In a non-limiting example, the target voltage circuit 14 includes an amplitude detection circuit 22 and an analog lookup table (LUT) 24. The amplitude detection circuit 22 is configured to detect a number of time-variant amplitudes 26 of the input signal 20 and the analog LUT 24 is configured to generate the time-variant ET target voltage $V_{TGTA}$ based on the time-variant amplitudes 26.

Figure 2:
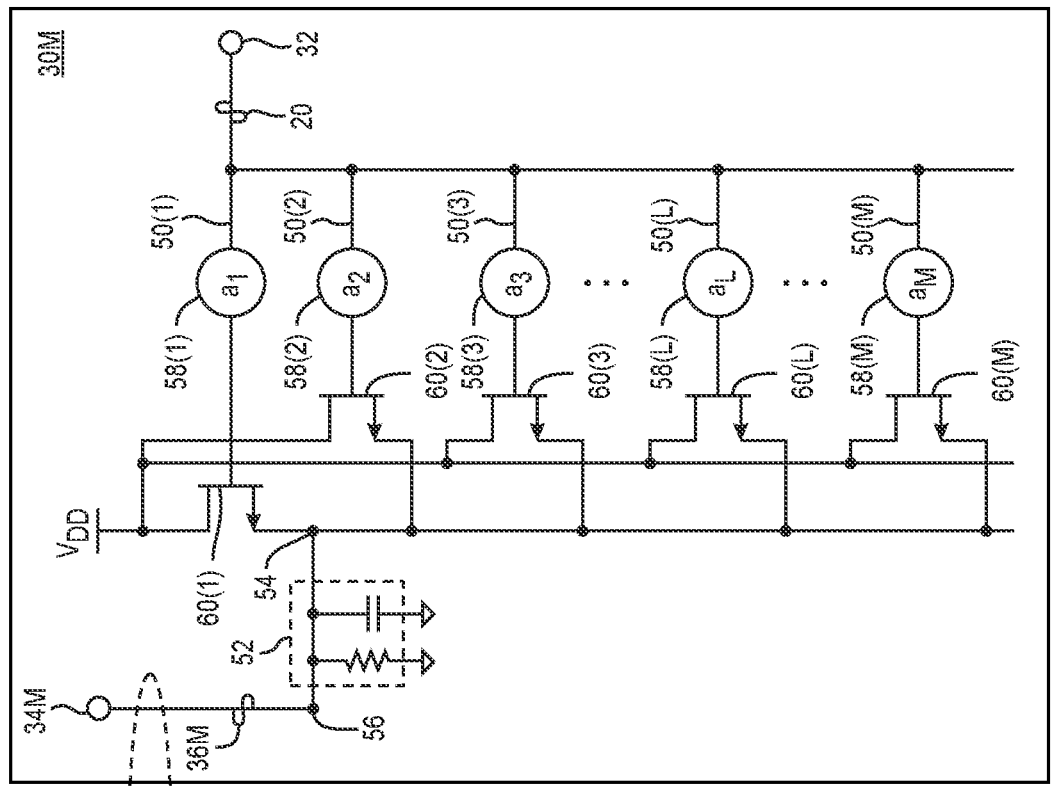
FIG. 2 is a schematic diagram of an exemplary differential amplitude detection circuit that can be provided in the ET RF front-end circuit of FIG. 1.
Figure 2:
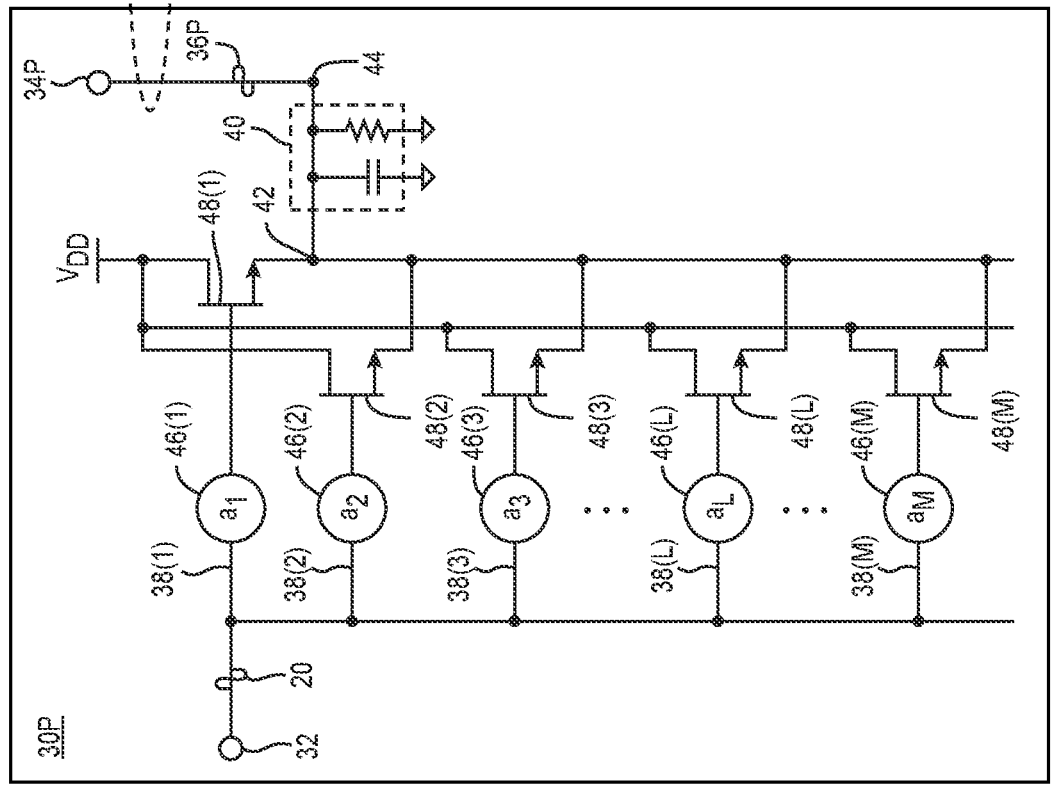

FIG. 2 is a schematic diagram of an exemplary differential amplitude detection circuit 28 that can be provided in the target voltage circuit 14 as the amplitude detection circuit 22. Common elements between FIGS. 1 and 2 are shown therein with common element numbers and will not be re-described herein.

In a non-limiting example, the differential amplitude detection circuit 28 includes a positive detection circuit 30P and a negative detection circuit 30M. The positive detection circuit 30P is coupled between a signal input 32, which is configured to receive the input signal 20, and a positive signal output 34P, which is configured to output a number of positive amplitudes 36P as part of the time-variant amplitudes 26.

The positive detection circuit 30P includes a number of first signal branches 38(1)-38(M) and a first resistor-capacitor (RC) circuit 40. The first RC circuit 40 has a first input 42 and a first output 44. The first output 44 is coupled to the positive signal output 34P. The first signal branches 38(1)-38(M) are disposed in parallel between the signal input 32 and the first input 42.

Each of the first signal branches 38(1)-38(M) includes a respective one of a number of first phase shifters 46(1)-46(M) coupled in series to a respective one of a number of n-type transistors 48(1)-48(M). Each of the first phase shifters 46(1)-46(M) is configured to shift the input signal 20 by a respective one of a number of predefined phases $\alpha_1$-$\alpha_M$. For example, the predefined phase $\alpha_1$ can be set to zero degree (0°), the predefined phase $\alpha_2$ can be set to thirty degrees (30°), the predefined phase $\alpha_L$ can be set to one hundred eighty degrees (180° or $\pi$), and so on.

The first RC circuit 40 is configured to detect the positive amplitudes 36P in the input signal 20 concurrently across the predefined phases $\alpha_1$-$\alpha_M$. By detecting the positive amplitudes 36P concurrently across the predefined phases $\alpha_1$-$\alpha_M$, the positive detection circuit 30P is able to detect the positive amplitudes 36P with reduced ripples. Notably, the more of the first signal branches 38(1)-38(M) there are in the positive detection circuit 30P, the finer the granularity the predefined phases $\alpha_1$-$\alpha_M$ can be. As a result, the more ripple reduction can be achieved by the positive detection circuit 30P.

The negative detection circuit 30M is coupled between the signal input 32, which is configured to receive the input signal 20, and a negative signal output 34M, which is configured to output a number of negative amplitudes 36M as part of the time-variant amplitudes 26.

The negative detection circuit 30M includes a number of second signal branches 50(1)-50(M) and a second RC circuit 52. The second RC circuit 52 has a second input 54 and a second output 56. The second output 56 is coupled to the negative signal output 34M. The second signal branches 50(1)-50(M) are disposed in parallel between the signal input 32 and the second input 54.

Each of the second signal branches 50(1)-50(M) includes a respective one of a number of second phase shifters 58(1)-58(M) coupled in series to a respective one of a number of p-type transistors 60(1)-60(M). Each of the second phase shifters 58(1)-58(M) is configured to shift the input signal 20 by a respective one of the predefined phases $\alpha_1$-$\alpha_M$. For example, the predefined phase $\alpha_1$ can be set to 0°, the predefined phase $\alpha_2$ can be set to 30°, the predefined phase $\alpha_L$ can be set to 180° or $\pi$, and so on.

The second RC circuit 52 is configured to detect the negative amplitudes 36M in the input signal 20 concurrently across the predefined phases $\alpha_1$-$\alpha_M$. By detecting the negative amplitudes 36M concurrently across the predefined phases $\alpha_1$-$\alpha_M$, the negative detection circuit 30M is able to detect the negative amplitudes 36M with reduced ripples. Notably, the more of the second signal branches 50(1)-50(M) there are in the negative detection circuit 30M, the finer the granularity the predefined phases $\alpha_1$-$\alpha_M$ can be. As a result, the more ripple reduction can be achieved by the negative detection circuit 30M.

With reference back to FIG. 1, by employing the differential amplitude detection circuit 28 of FIG. 2 to function as the amplitude detection circuit 22 in the target voltage circuit 14, the analog LUT 24 would receive the time-variant amplitudes 26 that include the positive amplitudes 36P and the negative amplitudes 36M. Accordingly, the analog LUT 24 is further configured to generate the time-variant ET target voltage $V_{TGTA}$ based on the positive amplitudes 36P and the negative amplitudes 36M.

The local transceiver circuit 16 may be coupled to a baseband transceiver circuit (not shown), which is separated from the ET RF front-end circuit 10 by a conductive distance that can stretch to several centimeters. The baseband transceiver circuit may provide the input signal 20 to the local transceiver circuit 16 in IF to help reduce distortion over the conductive distance. In this regard, in a non-limiting example, the baseband transceiver circuit can upconvert the input signal 20 from baseband frequency to the IF. The local transceiver circuit 16 is configured to generate a number of RF signals 62A(1)-62A(N) and a number of second RF signals 62B(1)-62B(N) in an RF frequency (a.k.a. carrier frequency) higher than the IF based on the input signal 20.

Each of the power amplifiers 18A(1)-18A(N) is coupled to a respective one a number of antenna ports 64A(1)-64A(N) and configured to amplify a respective one of the RF signals 62A(1)-62A(N) based on a respective one of the first ET voltages $V_{CCOA-1}$-$V_{CCOA-N}$ as well as the second ET voltage $VC_{CCDA}$. Each of the second power amplifiers 18B(1)-18B(N) is coupled to a respective one a number of second antenna ports 64B(1)-64B(N) and configured to amplify a respective one of the second RF signals 62B(1)-

62B(N) based on a respective one of the first ET voltages $V_{CCOA-1}$-$V_{CCOA-N}$ as well as the second ET voltage $V_{CCDA}$.

The antenna ports 64A(1)-64A(N) and the second antenna ports 64B(1)-64B(N) may each be coupled to a respective antenna (not shown) for radiating a respective one of the RF signals 62A(1)-62A(N) and the second RF signals 62B(1)-62B(N). The local transceiver circuit 16 may be configured to generate the RF signals 62A(1)-62A(N) in association with a number of phase offsets $\phi_{A1}$-$\phi_{AN}$, respectively, to provide required phase coherency among the RF signals 62A(1)-62A(N) such that the RF signals 62A(1)-62A(N) can be radiated by respective antennas via RF beamforming. Similarly, the local transceiver circuit 16 may be also configured to generate the second RF signals 62B(1)-62B(N) in association with a number of second phase offsets $\phi_{B1}$-$\phi_{BN}$, respectively, to provide required phase coherency among the second RF signals 62B(1)-62B(N) such that the second RF signals 62B(1)-62B(N) can be radiated by respective antennas via RF beamforming. Notably, each of RF signals 62A(1)-62A(N) may be identical to a respective one of the second RF signals 62B(1)-62B(N) (e.g., having the same content and encoding). As such, the RF signals 62A(1)-62A(N) and the second RF signals 62B(1)-62B(N) may be simultaneously radiated in different polarizations (e.g., horizontal and vertical polarizations).

In a non-limiting example, each of the power amplifiers 18A(1)-18A(N) is a multi-stage power amplifier that includes a driver stage amplifier 66 and one or more output stage amplifiers 68. The driver stage amplifier 66 in each of the power amplifiers 18A(1)-18A(N) is configured to amplify a respective one of the RF signals 62A(1)-62A(N) based on the second ET voltage $V_{CCDA}$. The output stage amplifiers 68 in each of the power amplifiers 18A(1)-18A(N) is coupled between the driver stage amplifier 66 and a respective one of the antenna ports 64A(1)-64A(N). Accordingly, the output stage amplifiers 68 in each of the power amplifiers 18A(1)-18A(N) are configured to further amplify the respective one of the RF signals 62A(1)-62A(N) based on a respective one of the first ET voltages $V_{CCOA-1}$-$V_{CCOA-N}$.

Likewise, each of the second power amplifiers 18B(1)-18B(N) is a multi-stage power amplifier that includes a second driver stage amplifier 70 and one or more second output stage amplifiers 72. The second driver stage amplifier 70 in each of the second power amplifiers 18B(1)-18B(N) is configured to amplify a respective one of the second RF signals 62B(1)-62B(N) based on the second ET voltage $V_{CCDA}$. The second output stage amplifiers 72 in each of the second power amplifiers 18B(1)-18B(N) is coupled between the second driver stage amplifier 70 and a respective one of the second antenna ports 64B(1)-64B(N). Accordingly, the second output stage amplifiers 72 in each of the second power amplifiers 18B(1)-18B(N) are configured to further amplify the respective one of the second RF signals 62B(1)-62B(N) based on a respective one of the first ET voltages $V_{CCOA-1}$-$V_{CCOA-N}$.

The ET RF front-end circuit 10 may include a calibration circuit 74 and a coupling circuit 76. The coupling circuit 76 may be provided between the power amplifiers 18A(1)-18A(N) and the antenna ports 64A(1)-64A(N) and/or between the second power amplifiers 18B(1)-18B(N) and the second antenna ports 64B(1)-64B(N). The coupling circuit 76 may be configured to provide a feedback signal 78 indicating an output power $P_{OUT}$ of any of the power amplifiers 18A(1)-18A(N) and/or any of the second power amplifiers 18B(1)-18B(N). Accordingly, the calibration circuit 74 may be configured to calibrate the analog LUT 24 based on the feedback signal 78. For a detailed description on specific embodiments of the calibration circuit 74, please refer to U.S. patent application Ser. No. 17/163,685, entitled "APPARATUS AND METHOD FOR CALIBRATING AN ENVELOPE TRACKING LOOKUP TABLE."

Figure 3:
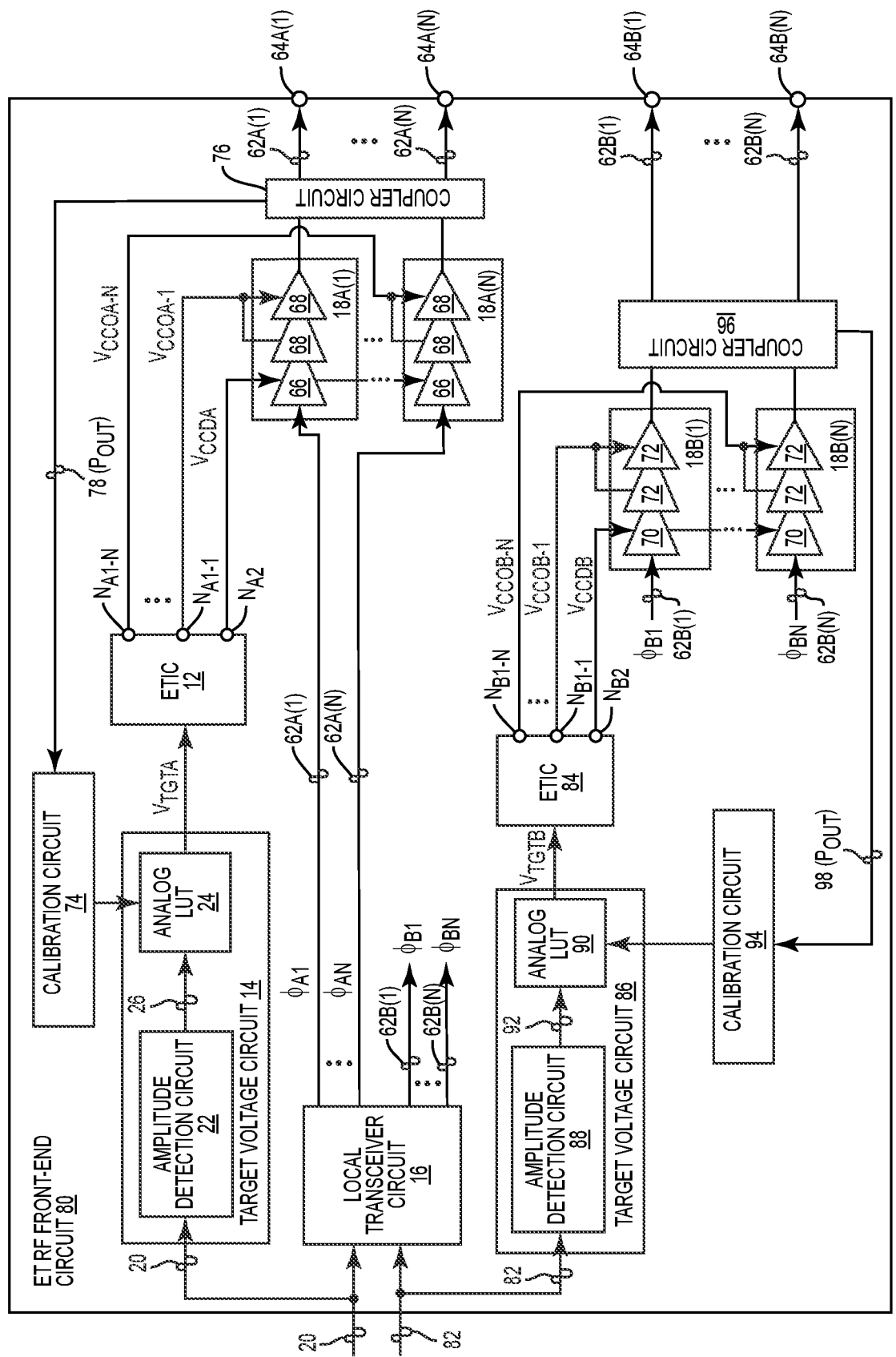
FIG. 3 is a schematic diagram of an exemplary ET RF front-end circuit configured according to another embodiment of the present disclosure.

As opposed to amplifying the RF signals 62A(1)-62A(N) that are different from the second RF signals 62B(1)-62B(N) as identical signals, the ET RF front-end circuit 10 may be adapted to amplify the RF signals 62A(1)-62A(N) that are different from the second RF signals 62B(1)-62B(N). In this regard, FIG. 3 is a schematic diagram of an exemplary ET RF front-end circuit 80 configured according to another embodiment of the present disclosure. Common elements between FIGS. 1 and 3 are shown therein with common element numbers and will not be re-described herein.

Herein, the local transceiver circuit 16 also receives a second input signal 82 that is different from the input signal 20. Similar to the input signal 20, the second input signal 82 may be generated in the IF by the same baseband transceiver that generates the input signal 20. Accordingly, the local transceiver circuit 16 generates the second RF signals 62B(1)-62B(N) based on the second input signal 82.

The ET RF front-end circuit 80 may include a second ETIC 84 and a second target voltage circuit 86. The second ETIC 84 is configured to generate a plurality of third ET voltages $V_{CCOB-1}$-$V_{CCOB-N}$ at a number of third output nodes $N_{B1-1}$-$N_{B1-N}$, respectively. The second ETIC 84 is also configured to generate a fourth ET voltage $V_{CCDB}$ at a fourth output node $N_{B2}$. The second ETIC 84 may generate the third output nodes $N_{B1-1}$-$N_{B1-N}$ and the fourth output node $N_{B2}$ based on a second time-variant ET target voltage $V_{TGTB}$.

The second target voltage circuit 86 is configured to generate the second time-variant ET target voltage $V_{TGTB}$ based on the second input signal 82. The second target voltage circuit 86 may include a second amplitude detection circuit 88 and a second analog LUT 90. The second amplitude detection circuit 88 is configured to detect a plurality of second time-variant amplitudes 92 of the second input signal 82. The second analog LUT 90 is configured to generate the second time-variant ET target voltage $V_{TGTB}$ based on the second time-variant amplitudes 92.

The second driver stage amplifier 70 in each of the second power amplifiers 18B(1)-18B(N) is coupled to the fourth output node $N_{B2}$ to receive the fourth ET voltage $V_{CCDB}$. The second output stage amplifiers 72 in each of the second power amplifiers 18B(1)-18B(N) is coupled to a respective one of the third output nodes $N_{B1-1}$-$N_{B1-N}$ to receive a respective one of the third ET voltages $V_{CCOB-1}$-$V_{CCOB-N}$. Accordingly, the second power amplifiers 18B(1)-18B(N) can amplify the second RF signals 62B(1)-62B(N) based on the third output nodes $N_{B1-1}$-$N_{B1-N}$ and the fourth ET voltage $V_{CCDB}$.

The ET RF front-end circuit 80 may also include a second calibration circuit 94 and a second coupling circuit 96. The second coupling circuit 96 may be coupled between the second power amplifiers 18B(1)-18B(N) and the second antenna ports 64B(1)-64B(N). The second coupling circuit 96 is configured to provide a second feedback signal 98 indicating an output power $P_{OUT}$ of any of the second power amplifiers 18B(1)-18B(N). Accordingly, the second calibration circuit 94 can calibrate the second analog LUT 90 based on the second feedback signal 98.

Figure 4:
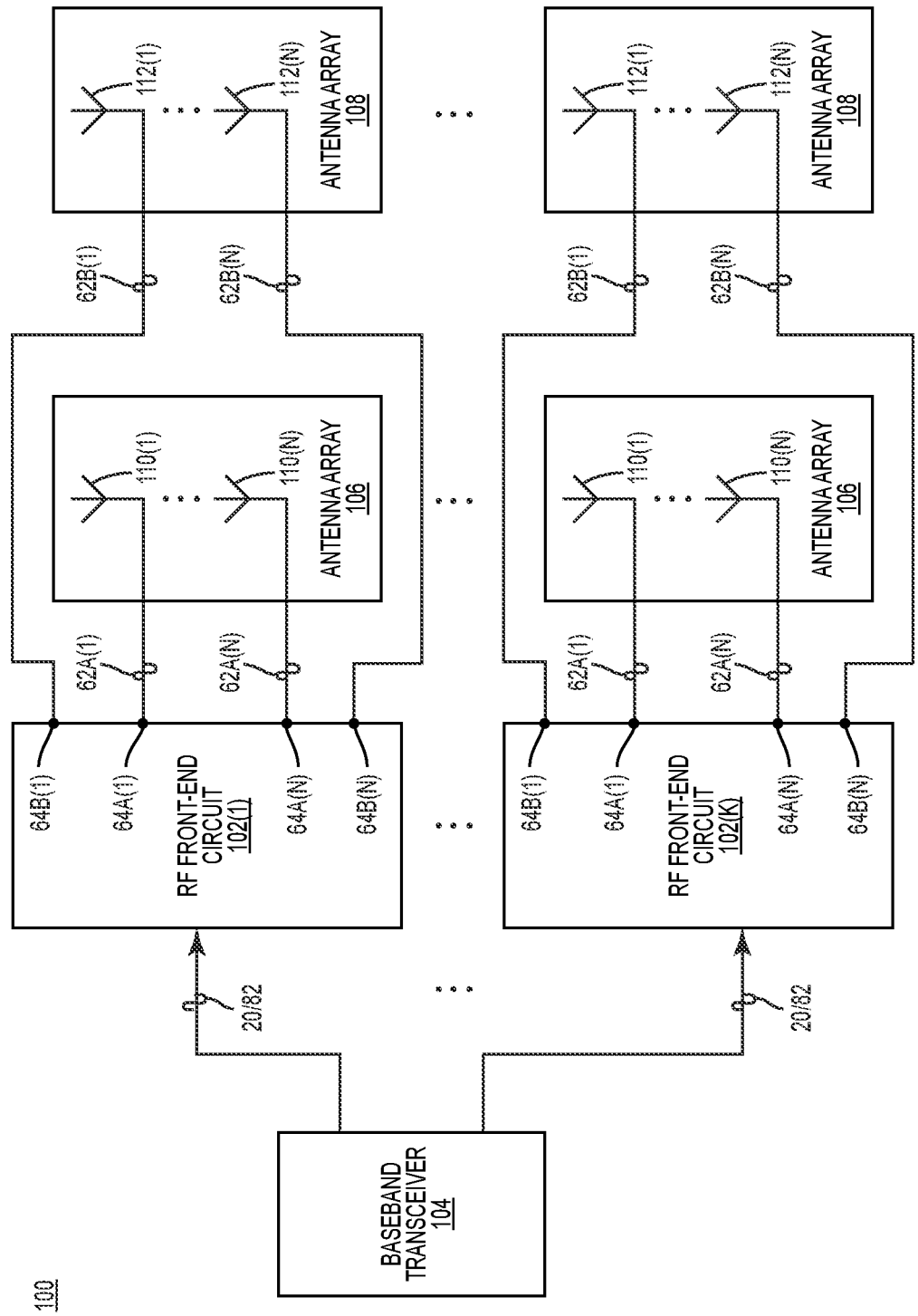
FIG. 4 is a schematic diagram of a wireless device including a number of the ET RF front-end circuits of FIG. 1 and/or FIG. 3.

One or more of the ET RF front-end circuit 10 of FIG. 1 and/or the ET RF front-end circuit 80 of FIG. 3 can be provided in a wireless device (e.g., a smartphone) to help enhance RF performance and user experience. In this regard, FIG. 4 is a schematic diagram of a wireless device 100 that includes a number of ET RF front-end circuits 102(1)-102(K), which can be any of the ET RF front-end circuit 10 of FIG. 1 and the ET RF front-end circuit 80 of FIG. 3. Common elements between FIGS. 1, 3, and 4 are shown therein with common element numbers and will not be re-described herein.

The wireless device 100 includes a baseband transceiver 104 that is separated from any of the ET RF front-end circuits 102(1)-102(K). The baseband transceiver 104 is configured the generate the input signal 20 and the second input signal 82.

Each of the ET RF front-end circuits 102(1)-102(K) is coupled to a first antenna array 106 and a second antenna array 108. The first antenna array 106 includes a number of first antennas 110(1)-110(N), each coupled to a respective one of the antenna ports 64A(1)-64A(N) and configured to radiate a respective one of the RF signals 62A(1)-62A(N) in a first polarization (e.g., horizontal polarization). The second antenna array 108 includes a number of second antennas 112(1)-112(N), each coupled to a respective one of the second antenna ports 64B(1)-64B(N) and configured to radiate a respective one of the second RF signals 62B(1)-62B(N) in a second polarization (e.g., vertical polarization).

The ET RF front-end circuits 102(1)-102(K) may be disposed in different locations in the wireless device 100 to help enhance RF performance and improve user experience. For example, some of the ET RF front-end circuits 102(1)-102(K) may be provided on a top edge of the wireless device 100, while some of the ET RF front-end circuits 102(1)-102(K) are provided on a bottom edge of the wireless device 100.

Those skilled in the art will recognize improvements and modifications to the preferred embodiments of the present disclosure. All such improvements and modifications are considered within the scope of the concepts disclosed herein and the claims that follow.

What is claimed is:

1. An envelope tracking (ET) radio frequency (RF) front-end circuit comprising:
    an ET integrated circuit (ETIC) configured to generate a plurality of first ET voltages and a second ET voltage based on a time-variant ET target voltage;
    a target voltage circuit configured to generate the time-variant ET target voltage based on an input signal;
    a local transceiver circuit configured to generate a plurality of RF signals based on the input signal; and
    a plurality of power amplifiers coupled to a plurality of antenna ports, respectively, each of the plurality of power amplifiers comprising:
        a driver stage amplifier configured to amplify a respective one of the plurality of RF signals based on the second ET voltage; and
        one or more output stage amplifiers coupled between the driver stage amplifier and a respective one of the plurality of antenna ports, the one or more output stage amplifiers configured to further amplify the respective one of the plurality of RF signals based on a respective one of the plurality of first ET voltages.

2. The ET RF front-end circuit of claim 1 wherein the local transceiver circuit is further configured to:
    receive the input signal in an intermediate frequency (IF) from a coupled baseband transceiver circuit;
    convert the input signal into the plurality of RF signals in an RF frequency higher than the IF; and
    output the plurality of RF signals in a plurality of phase offsets, respectively.

3. The ET RF front-end circuit of claim 1 further comprising a plurality of second power amplifiers coupled to a plurality of second antenna ports, respectively, wherein:
    the local transceiver circuit is further configured to generate a plurality of second RF signals based on the input signal; and
    each of the plurality of second power amplifiers comprises:
        a second driver stage amplifier configured to amplify a respective one of the plurality of second RF signals based on the second ET voltage; and
        one or more second output stage amplifiers coupled between the second driver stage amplifier and a respective one of the plurality of second antenna ports, the one or more second output stage amplifiers configured to further amplify the respective one of the plurality of second RF signals based on a respective one of the plurality of first ET voltages.

4. The ET RF front-end circuit of claim 1 wherein the target voltage circuit comprises:
    an amplitude detection circuit configured to detect a plurality of time-variant amplitudes of the input signal; and
    an analog lookup table (LUT) configured to generate the time-variant ET target voltage based on the plurality of time-variant amplitudes.

5. The ET RF front-end circuit of claim 4 wherein the amplitude detection circuit comprises:
    a positive detection circuit coupled between a signal input and a positive signal output, the positive detection circuit comprising:
        a plurality of first signal branches disposed in parallel and each configured to shift the input signal by a respective one of a plurality of predefined phases; and
        a first resistor-capacitor (RC) circuit configured to output, via the positive signal output, a plurality of positive amplitudes among the plurality of time-variant amplitudes that is detected across the plurality of predefined phases; and
    a negative detection circuit coupled between the signal input and a negative signal output, the negative detection circuit comprising:
        a plurality of second signal branches disposed in parallel and each configured to shift the input signal by the respective one of the plurality of predefined phases; and
        a second RC circuit configured to output, via the negative signal output, a plurality of negative amplitudes among the plurality of time-variant amplitudes that is detected across the plurality of predefined phases.

6. The ET RF front-end circuit of claim 5 wherein the analog LUT is further configured to generate the time-variant ET target voltage based on the plurality of positive amplitudes and the plurality of negative amplitudes received from the amplitude detection circuit.

7. The ET RF front-end circuit of claim 4 further comprising:
    a coupling circuit coupled between the plurality of power amplifiers and the plurality of antenna ports, the coupling circuit configured to provide a feedback signal indicating an output power of any of the plurality of power amplifiers; and
    a calibration circuit configured to calibrate the analog LUT based on the feedback signal.

8. The ET RF front-end circuit of claim 1 further comprising:
a second ETIC configured to generate a plurality of third ET voltages and a fourth ET voltage based on a second time-variant ET target voltage;
a second target voltage circuit configured to generate the second time-variant ET target voltage based on a second input signal, wherein the local transceiver circuit is further configured to generate a plurality of second RF signals based on the second input signal; and
a plurality of second power amplifiers coupled to a plurality of second antenna ports, respectively, each of the plurality of second power amplifiers comprising:
a second driver stage amplifier configured to amplify a respective one of the plurality of second RF signals based on the fourth ET voltage; and
one or more second output stage amplifiers coupled between the second driver stage amplifier and a respective one of the plurality of second antenna ports, the one or more second output stage amplifiers configured to further amplify the respective one of the plurality of second RF signals based on a respective one of the plurality of third ET voltages.

9. The ET RF front-end circuit of claim 8 wherein the local transceiver circuit is further configured to:
receive the second input signal in the IF from a coupled baseband transceiver circuit;
convert the second input signal into the plurality of second RF signals in the RF frequency higher than the IF; and
output the plurality of second RF signals in a plurality of second phase offsets, respectively.

10. The ET RF front-end circuit of claim 8 wherein the second target voltage circuit comprises:
a second amplitude detection circuit configured to detect a plurality of second time-variant amplitudes of the second input signal; and
a second analog LUT configured to generate the second time-variant ET target voltage based on the plurality of second time-variant amplitudes.

11. The ET RF front-end circuit of claim 10 further comprising:
a second coupling circuit coupled between the plurality of second power amplifiers and the plurality of second antenna ports, the second coupling circuit configured to provide a second feedback signal indicating an output power of any of the plurality of second power amplifiers; and
a second calibration circuit configured to calibrate the second analog LUT based on the second feedback signal.

12. A wireless device comprising:
a plurality of envelope tracking (ET) radio frequency (RF) front-end circuits each comprising:
an ET integrated circuit (ETIC) configured to generate a plurality of first ET voltages and a second ET voltage based on a time-variant ET target voltage;
a target voltage circuit configured to generate the time-variant ET target voltage based on an input signal;
a local transceiver circuit configured to generate a plurality of RF signals based on the input signal; and
a plurality of power amplifiers coupled to a plurality of antenna ports, respectively, each of the plurality of power amplifiers comprising:
a driver stage amplifier configured to amplify a respective one of the plurality of RF signals based on the second ET voltage; and
one or more output stage amplifiers coupled between the driver stage amplifier and a respective one of the plurality of antenna ports, the one or more output stage amplifiers configured to further amplify the respective one of the plurality of RF signals based on a respective one of the plurality of first ET voltages.

13. The wireless device of claim 12 wherein the local transceiver circuit is further configured to:
receive the input signal in an intermediate frequency (IF) from a coupled baseband transceiver circuit;
convert the input signal into the plurality of RF signals in an RF frequency higher than the IF; and
output the plurality of RF signals in a plurality of phase offsets, respectively.

14. The wireless device of claim 12 wherein the ET RF front-end circuit further comprises a plurality of second power amplifiers coupled to a plurality of second antenna ports, respectively, wherein:
the local transceiver circuit is further configured to generate a plurality of second RF signals based on the input signal; and
each of the plurality of second power amplifiers comprises:
a second driver stage amplifier configured to amplify a respective one of the plurality of second RF signals based on the second ET voltage; and
one or more second output stage amplifiers coupled between the second driver stage amplifier and a respective one of the plurality of second antenna ports, the one or more second output stage amplifiers configured to further amplify the respective one of the plurality of second RF signals based on a respective one of the plurality of first ET voltages.

15. The wireless device of claim 12 wherein the target voltage circuit comprises:
an amplitude detection circuit configured to detect a plurality of time-variant amplitudes of the input signal; and
an analog lookup table (LUT) configured to generate the time-variant ET target voltage based on the plurality of time-variant amplitudes.

16. The wireless device of claim 15 wherein each of the plurality of ET RF front-end circuits further comprises:
a coupling circuit coupled between the plurality of power amplifiers and the plurality of antenna ports, the coupling circuit configured to provide a feedback signal indicating an output power of any of the plurality of power amplifiers; and
a calibration circuit configured to calibrate the analog LUT based on the feedback signal.

17. The wireless device of claim 12 wherein each of the plurality of ET RF front-end circuits further comprises:
a second ETIC configured to generate a plurality of third ET voltages and a fourth ET voltage based on a second time-variant ET target voltage;
a second target voltage circuit configured to generate the second time-variant ET target voltage based on a second input signal, wherein the local transceiver circuit is further configured to generate a plurality of second RF signals based on the second input signal; and
a plurality of second power amplifiers coupled to a plurality of second antenna ports, respectively, each of the plurality of second power amplifiers comprising:

a second driver stage amplifier configured to amplify a respective one of the plurality of second RF signals based on the fourth ET voltage; and one or more second output stage amplifiers coupled between the second driver stage amplifier and a respective one of the plurality of second antenna ports, the one or more second output stage amplifiers configured to further amplify the respective one of the plurality of second RF signals based on a respective one of the plurality of third ET voltages.

18. The wireless device of claim 17 wherein the local transceiver circuit is further configured to:

receive the second input signal in the IF from a coupled baseband transceiver circuit;

convert the second input signal into the plurality of second RF signals in the RF frequency higher than the IF; and output the plurality of second RF signals in a plurality of second phase offsets, respectively.

19. The wireless device of claim 17 wherein the second target voltage circuit comprises:

a second amplitude detection circuit configured to detect a plurality of second time-variant amplitudes of the second input signal; and a second analog LUT configured to generate the second time-variant ET target voltage based on the plurality of second time-variant amplitudes.

20. The wireless device of claim 19 wherein each of the plurality of ET RF front-end circuits further comprises:

a second coupling circuit coupled between the plurality of second power amplifiers and the plurality of second antenna ports, the second coupling circuit configured to provide a second feedback signal indicating an output power of any of the plurality of second power amplifiers; and a second calibration circuit configured to calibrate the second analog LUT based on the second feedback signal.

* * * * *